US012598974B2

(12) United States Patent
Peng et al.

(10) Patent No.: US 12,598,974 B2
(45) Date of Patent: Apr. 7, 2026

(54) CHIP PACKAGE AND MANUFACTURING METHOD THEREOF

(71) Applicant: XINTEC INC., Taoyuan City (TW)

(72) Inventors: Ching-Ting Peng, Taoyuan City (TW); Sheng-Hsiang Fu, Taoyuan City (TW); Hsin-Yi Chen, Taoyuan City (TW)

(73) Assignee: XINTEC INC., Taoyuan City (TW)

( * ) Notice: Subject to any disclaimer, the term of this patent is extended or adjusted under 35 U.S.C. 154(b) by 440 days.

(21) Appl. No.: 18/157,033

(22) Filed: Jan. 19, 2023

(65) Prior Publication Data

US 2023/0238305 A1      Jul. 27, 2023

Related U.S. Application Data

(60) Provisional application No. 63/303,431, filed on Jan. 26, 2022.

(51) Int. Cl.
_H10W 20/20_          (2026.01)
_H10P 50/00_          (2026.01)
(Continued)

(52) U.S. Cl.
CPC ........... _H10W 20/20_ (2026.01); _H10P 50/695_ (2026.01); _H10P 52/00_ (2026.01); _H10P 58/00_ (2026.01);
(Continued)

(58) Field of Classification Search
CPC .............. H01L 21/304; H01L 21/3086; H01L 21/6835; H01L 21/78; H01L 21/76898; H01L 21/56; H01L 23/481; H01L 23/3677; H01L 23/3121; H01L 24/03; H01L 24/05; H01L 24/02; H01L 24/32; H10W 20/20; H10W 72/019; H10W 70/05;
(Continued)

(56) References Cited

U.S. PATENT DOCUMENTS

2011/0291139 A1* 12/2011 Chiu ..................... H10F 39/804
257/E33.056
2012/0146111 A1* 6/2012 Chang ............... H01L 21/76898
257/E21.409
(Continued)

FOREIGN PATENT DOCUMENTS

JP          2014011309 A  *  1/2014   ......... H01L 2224/13
TW          201225300 A     6/2012

OTHER PUBLICATIONS

Maenosono Toshiyuki, JP-2014011309-A, Machine Translation (Year: 2014).*

*Primary Examiner* — Andres Munoz
(74) *Attorney, Agent, or Firm* — LIU & LIU

(57) ABSTRACT

A chip package includes a semiconductor substrate, a conductive pad, an isolation layer, and a redistribution layer. The semiconductor substrate has a first surface, a second surface facing away from the first surface, a through hole through the first and second surfaces, and a recess in the first surface. The conductive pad is located on the second surface of the semiconductor substrate and in the through hole. The isolation layer is located on the second surface of the semiconductor substrate and surrounds the conductive pad. The redistribution layer is located on the first surface of the semiconductor substrate, and extends into the recess, and extends onto the conductive pad in the through hole.

18 Claims, 12 Drawing Sheets

(51) Int. Cl.

| | |
|---|---|
| *H10P 52/00* | (2026.01) |
| *H10P 58/00* | (2026.01) |
| *H10P 72/70* | (2026.01) |
| *H10W 72/00* | (2026.01) |
| *H10W 70/05* | (2026.01) |
| *H10W 70/652* | (2026.01) |
| *H10W 72/90* | (2026.01) |
| *H10W 90/00* | (2026.01) |

(52) U.S. Cl.
CPC ........... *H10P 72/74* (2026.01); *H10W 72/019* (2026.01); *H10P 72/7436* (2026.01); *H10W 70/05* (2026.01); *H10W 70/652* (2026.01); *H10W 72/922* (2026.01); *H10W 72/923* (2026.01); *H10W 72/9415* (2026.01); *H10W 72/942* (2026.01); *H10W 90/734* (2026.01)

(58) Field of Classification Search
CPC ............. H10W 70/652; H10W 72/922; H10W 72/923; H10W 72/9415; H10W 72/942; H10W 90/734; H10P 50/695; H10P 52/00; H10P 58/00; H10P 72/74; H10P 72/7436; H10P 54/00; H10P 72/7416; H10P 72/743
See application file for complete search history.

(56) References Cited

U.S. PATENT DOCUMENTS

| | | | |
|---|---|---|---|
| 2014/0008815 A1* | 1/2014 | Park | H01L 21/76898 |
| | | | 257/774 |
| 2018/0033735 A1* | 2/2018 | Ozawa | H10D 62/115 |
| 2019/0081006 A1 | 3/2019 | Ozawa | |

\* cited by examiner

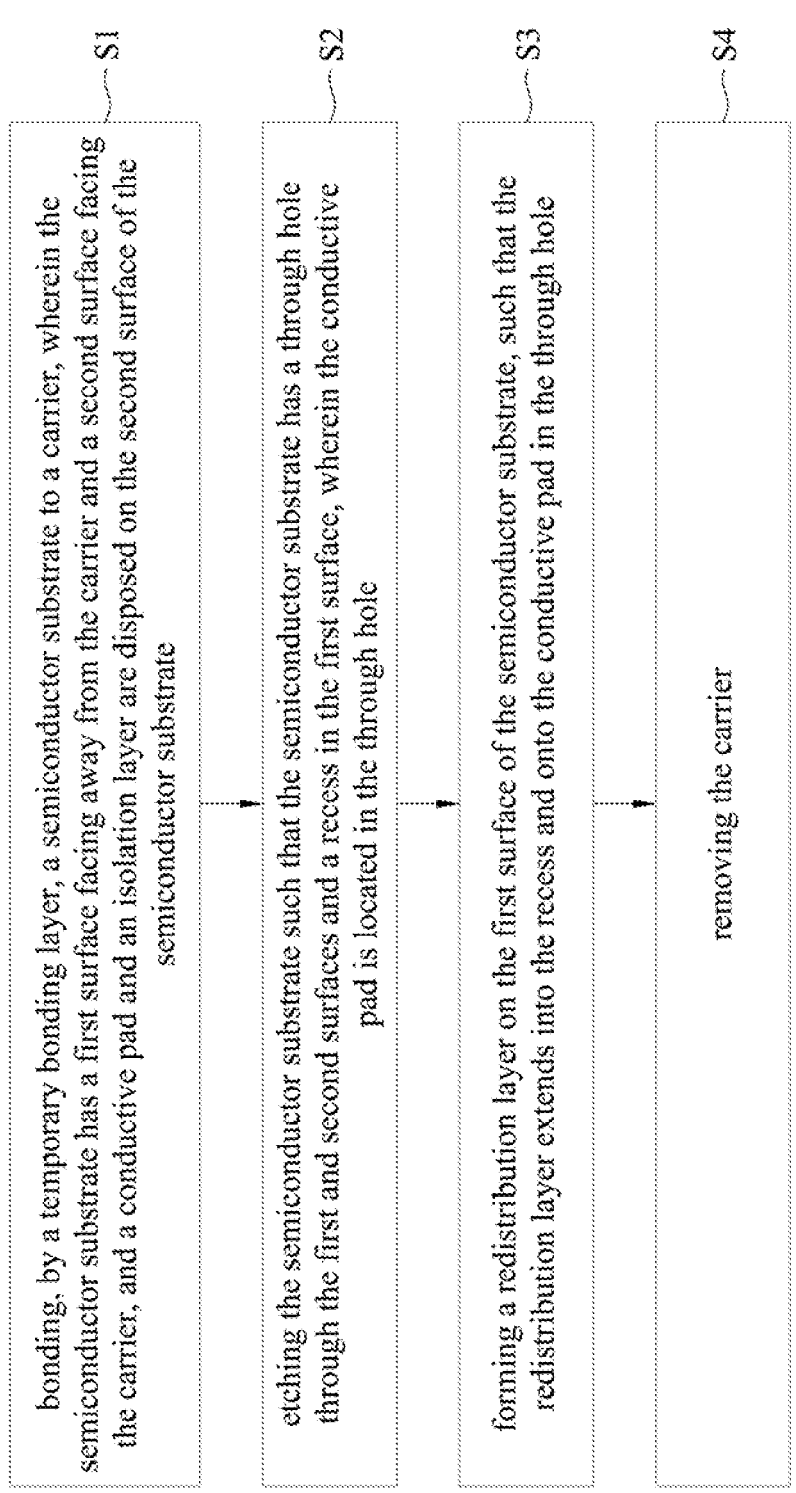

bonding, by a temporary bonding layer, a semiconductor substrate to a carrier, wherein the semiconductor substrate has a first surface facing away from the carrier and a second surface facing the carrier, and a conductive pad and an isolation layer are disposed on the second surface of the semiconductor substrate                                 — S1 etching the semiconductor substrate such that the semiconductor substrate has a through hole through the first and second surfaces and a recess in the first surface, wherein the conductive pad is located in the through hole                                 — S2 forming a redistribution layer on the first surface of the semiconductor substrate, such that the redistribution layer extends into the recess and onto the conductive pad in the through hole                                 — S3 removing the carrier                                 — S4

Fig. 2

CHIP PACKAGE AND MANUFACTURING METHOD THEREOF

CROSS-REFERENCE TO RELATED APPLICATIONS

This application claims priority to U.S. Provisional Application Ser. No. 63/303,431, filed Jan. 26, 2022 which is herein incorporated by reference.

BACKGROUND

Field of Invention

The present disclosure relates to a chip package and a manufacturing method of the chip package.

Description of Related Art

With the advancement of integrated circuit (IC) manufacturing technology, the chip can have multiple functions, and the computing power of the chip is getting faster and faster, but these advantages will cause more heat to be generated in the chip package. However, if an additional heat conduction structure is provided outside the chip package, it will be unfavorable for the miniaturization design, and it is difficult to reduce the assembly time and labor cost.

SUMMARY

One aspect of the present disclosure provides a chip package.

According to some embodiments of the present disclosure, a chip package includes a semiconductor substrate, a conductive pad, an isolation layer, and a redistribution layer. The semiconductor substrate has a first surface, a second surface facing away from the first surface, a through hole through the first and second surfaces, and a recess in the first surface. The conductive pad is located on the second surface of the semiconductor substrate and in the through hole. The isolation layer is located on the second surface of the semiconductor substrate and surrounds the conductive pad. The redistribution layer is located on the first surface of the semiconductor substrate, and extends into the recess, and extends onto the conductive pad in the through hole.

In some embodiments, a depth of the recess is less than a depth of the through hole.

In some embodiments, a depth of the recess is less than a thickness of the semiconductor substrate.

In some embodiments, a depth of the recess is less than a distance between the first and second surfaces of the semiconductor substrate.

In some embodiments, a diameter of the recess is less than a diameter of the through hole.

In some embodiments, a top surface of the redistribution layer on the recess is concave.

In some embodiments, the chip package further includes a seed layer located between the redistribution layer and the first surface of the semiconductor substrate.

In some embodiments, the conductive pad includes a plurality of metal layers electrically connected to each other, the isolation layer includes a plurality of dielectric layers, and the number of the metal layers is the same as the number of the dielectric layers.

In some embodiments, the lowest one of the metal layers does not overlap the lowest one of the dielectric layers.

Another aspect of the present disclosure provides a manufacturing method of a chip package.

According to some embodiments of the present disclosure, a manufacturing method of a chip package includes bonding, by a temporary bonding layer, a semiconductor substrate to a carrier, wherein the semiconductor substrate has a first surface facing away from the carrier and a second surface facing the carrier, and a conductive pad and an isolation layer are disposed on the second surface of the semiconductor substrate; etching the semiconductor substrate such that the semiconductor substrate has a through hole through the first and second surfaces and a recess in the first surface, wherein the conductive pad is located in the through hole; forming a redistribution layer on the first surface of the semiconductor substrate, such that the redistribution layer extends into the recess and onto the conductive pad in the through hole; and removing the carrier.

In some embodiments, the manufacturing method of the chip package further includes forming a seed layer on the first surface of the semiconductor substrate, in the recess, and on the conductive pad that is in the through hole.

In some embodiments, the manufacturing method of the chip package further includes forming the redistribution layer on the seed layer.

In some embodiments, the redistribution layer is formed on the seed layer by electroplating.

In some embodiments, the manufacturing method of the chip package further includes patterning the seed layer such that an opening of the seed layer defines a dicing trench.

In some embodiments, the manufacturing method of the chip package further includes after removing the carrier, cutting the semiconductor substrate and the isolation layer along the dicing trench.

In some embodiments, the manufacturing method of the chip package further includes prior to etching the semiconductor substrate, grinding the first surface of the semiconductor substrate to thin the semiconductor substrate.

In the aforementioned embodiments of the present disclosure, since the semiconductor substrate has the recess in the first surface and the through hole through the first and second surfaces, and the redistribution layer extends into the recess and onto the conductive pad in the through hole, the density of metal patterns on the semiconductor substrate can be increased. As a result, heat generated from the chip package can be dissipated through the redistribution layer, thereby electively improving the heat transfer efficiency of the chip package. Moreover, the redistribution layer may serve as a ground line for the conductive pad to provide the grounding function of the conductive pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flow chart of a manufacturing method of a chip package according to one embodiment of the present disclosure.

DETAILED DESCRIPTION

Figure 1:
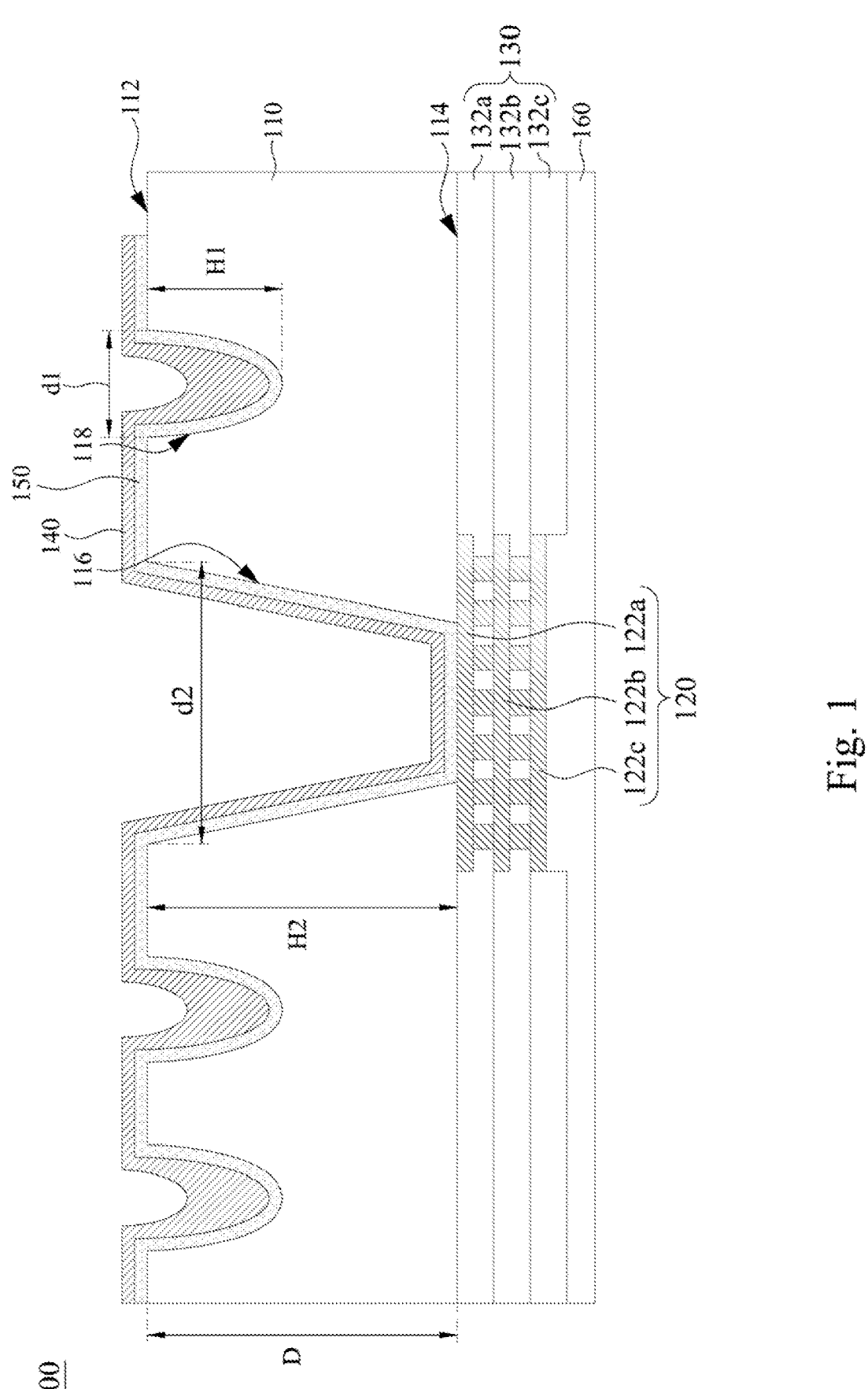
FIG. 1 is a cross-sectional view of a chip package according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a chip package 100 according to one embodiment of the present disclosure. As shown in FIG. 1, the chip package 100 includes a semiconductor substrate 110, a conductive pad 120, an isolation layer 130, and a redistribution layer 140. The semiconductor substrate 110 has a first surface 112, a second surface 114, a through hole 116, and a recess 118. The second surface 114 faces away from the first surface 112. The through hole 116 through the first surface 112 and the second surface 114. The recess 118 is located in the first surface 112, and is a blind hole. The conductive pad 120 is located on the second surface 114 of the semiconductor substrate 110 and in the through hole 116. The isolation layer 130 is located on the second surface 114 of the semiconductor substrate 110 and surrounds the conductive pad 120. The redistribution layer 140 is located on the first surface 112 of the semiconductor substrate 110. The redistribution layer 140 extends into the recess 118, and extends onto the conductive pad 120 that is in the through hole 116.

In this embodiment, the semiconductor substrate 110 may be a silicon substrate. Furthermore, the semiconductor substrate 110 further includes a seed layer 150. By sputtering, the seed layer 150 may be formed on the first surface 112 of the semiconductor substrate 110, and may extend into the recess 118 and onto the conductive pad 120 in the through hole 116. The redistribution layer 140 may be formed on the seed layer 150 by electroplating, such that the seed layer 150 is located between the redistribution layer 140 and the first surface 112 of the semiconductor substrate 110. The material of the redistribution layer 140 and the material of the seed layer 150 may be copper, the material of the isolation layer 130 may be silicon dioxide ($SiO_2$), but the present disclosure is not limited in this regard.

Specifically, since the semiconductor substrate 110 of the chip package 100 has the recess 118 in the first surface 112 and the through hole 116 through the first and second surfaces 112 and 114, and the redistribution layer 140 extends into the recess 118 and onto the conductive pad 120 in the through hole 116, the density of metal patterns on the semiconductor substrate 110 can be increased. As a result, heat generated from the chip package 100 can be dissipated through the redistribution layer 140, thereby electively improving the heat transfer efficiency of the chip package 100. Moreover, the redistribution layer 140 may serve as a ground line for the conductive pad 120 to provide the grounding function of the conductive pad 120.

In this embodiment, the conductive pad 120 may include plural metal layers 122a, 122b, and 122c electrically connected to each other, such as using vias between upper and lower layers for connection. The isolation layer 130 may include plural dielectric layers 132a, 132b, and 132c. The number of the metal layers may be the same as the number of the dielectric layers. For example, in FIG. 1, the number of the metal layers and the number of the dielectric layers are both three, but the present disclosure is not limited in this regard. In this embodiment, the lowest one of the metal layers (i.e., the metal layer 122c) does not overlap the lowest one of the dielectric layers (i.e., the dielectric layer 132c) in a vertical direction. In other words, the bottom surface of the metal layer 122c is not covered by the dielectric layer 132c.

In addition, in this embodiment, a depth H1 of the recess 118 of the semiconductor substrate 110 is less than a depth H2 of the through hole 116. The depth H1 of the recess 118 is less than a thickness D of the semiconductor substrate 110. That is, the depth H1 of the recess 118 is less than a distance (the same as the thickness D) between the first and second surfaces 112 and 114 of the semiconductor substrate 110. A diameter d1 of the recess 118 is less than a diameter d2 of the through hole 116. Furthermore, a top surface of the redistribution layer 140 on the recess 118 is concave.

It is to be noted that the connection relationships, the materials, and the advantages of the elements described above will not be repeated in the following description. In the following description, the manufacturing method of the chip package 100 will be explained.

FIG. 2 is a flow chart of a manufacturing method of a chip package according to one embodiment of the present disclosure. The manufacturing method of the chip package includes the following steps. In step S1, a semiconductor substrate is bonded to a carrier by a temporary bonding layer, wherein the semiconductor substrate has a first surface facing away from the carrier and a second surface facing the carrier, and a conductive pad and an isolation layer are disposed on the second surface of the semiconductor substrate. Thereafter, in step S2, the semiconductor substrate is etched such that the semiconductor substrate has a through hole through the first and second surfaces and a recess in the first surface, wherein the conductive pad is located in the through hole. Afterwards, in step S3, a redistribution layer is formed on the first surface of the semiconductor substrate, such that the redistribution layer extends into the recess and onto the conductive pad in the through hole. Subsequently, in step S4, the carrier is removed. In the following description, the aforementioned steps and other steps which may be included will be explained in detail.

Figure 3:
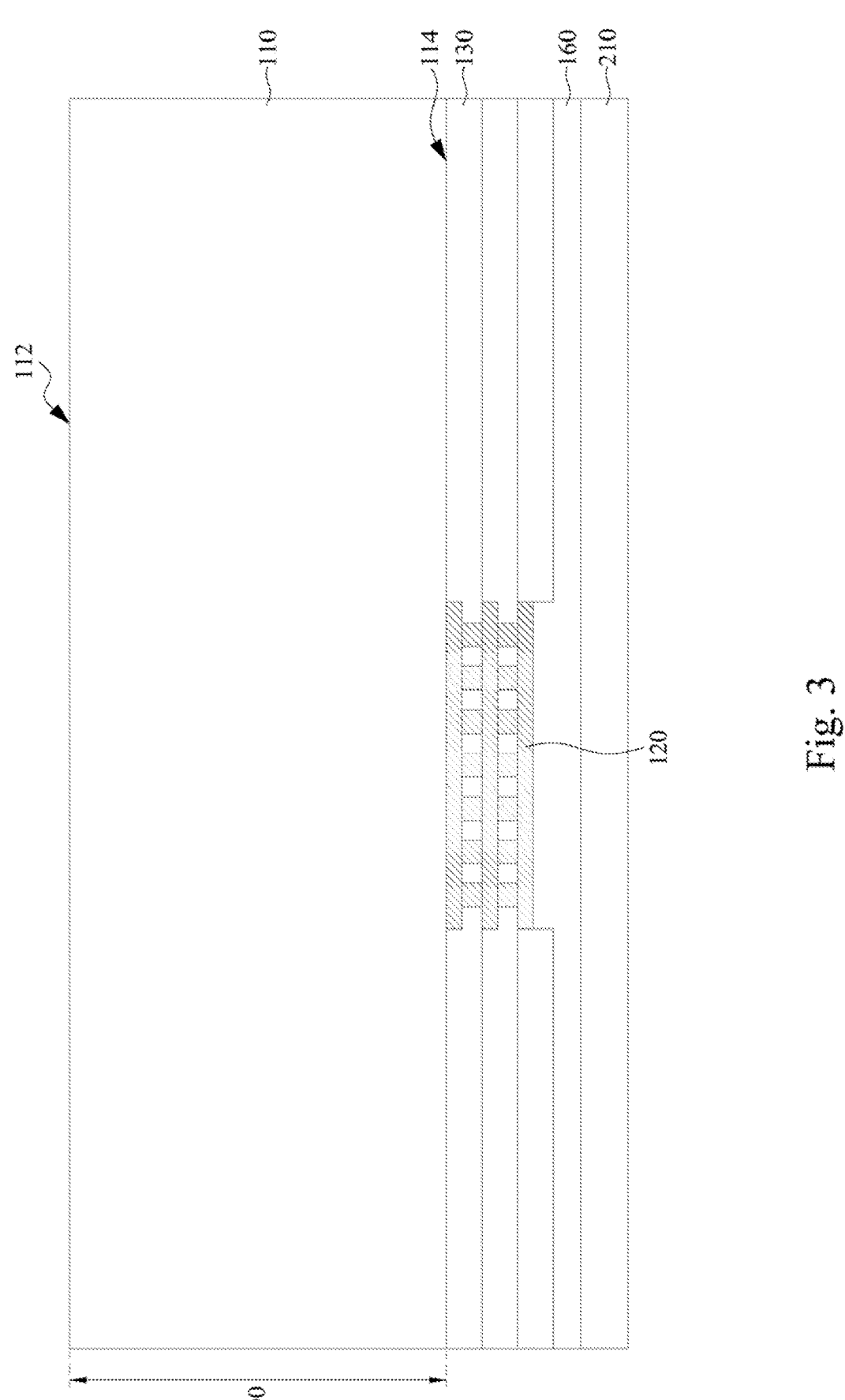
FIGS. 3 to 12 are cross-sectional views at intermediate stages of a manufacturing method of a chip package according to one embodiment of the present disclosure.

FIGS. 3 to 12 are cross-sectional views at intermediate stages of a manufacturing method of a chip package according to one embodiment of the present disclosure. As shown in FIG. 3, the semiconductor substrate 110 is bonded to a carrier 210 by a temporary bonding layer 160, wherein the semiconductor substrate 110 has the first surface 112 facing away from the carrier 210 and the second surface 114 facing the carrier 210, and the conductive pad 120 and the isolation layer 130 are disposed on the second surface 114 of the semiconductor substrate 110. In order to simplify the description, in the following description, the conductive pad 120 is referred to as the stack structure of the three metal layers 122a, 122b, and 122c of FIG. 1, and the isolation layer 130 is referred to as the stack structure of the three dielectric layers 132a, 132b, and 132c of FIG. 1.

In this step, the semiconductor substrate 110 has a thickness DO. The semiconductor substrate 110 is not cut yet, and may be wafer level. The carrier 210 provides a supporting force for the semiconductor substrate 110 in subsequent processes.

Figure 4:
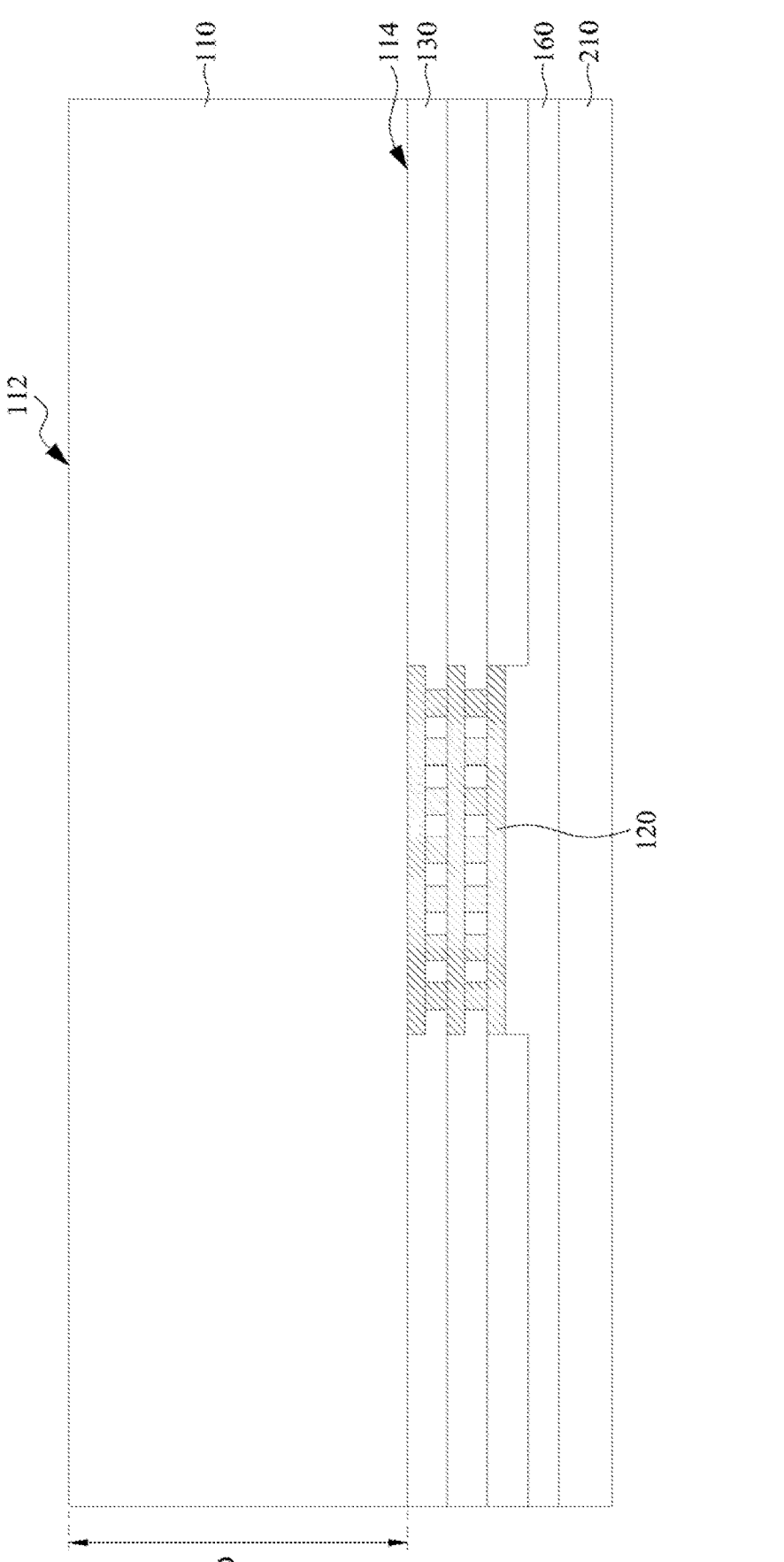

Referring to FIG. 4, thereafter, grinding is performed on the first surface 112 of the semiconductor substrate 110 to thin the semiconductor substrate 110. After the grinding, the semiconductor substrate 110 has the thickness D less than the thickness DO. This grinding step is performed prior to etching the semiconductor substrate 110, which is beneficial to reduce the time for forming the through hole 116 (see FIG. 1) and reduce the overall thickness of the chip package 100 (see FIG. 1).

Figure 5:
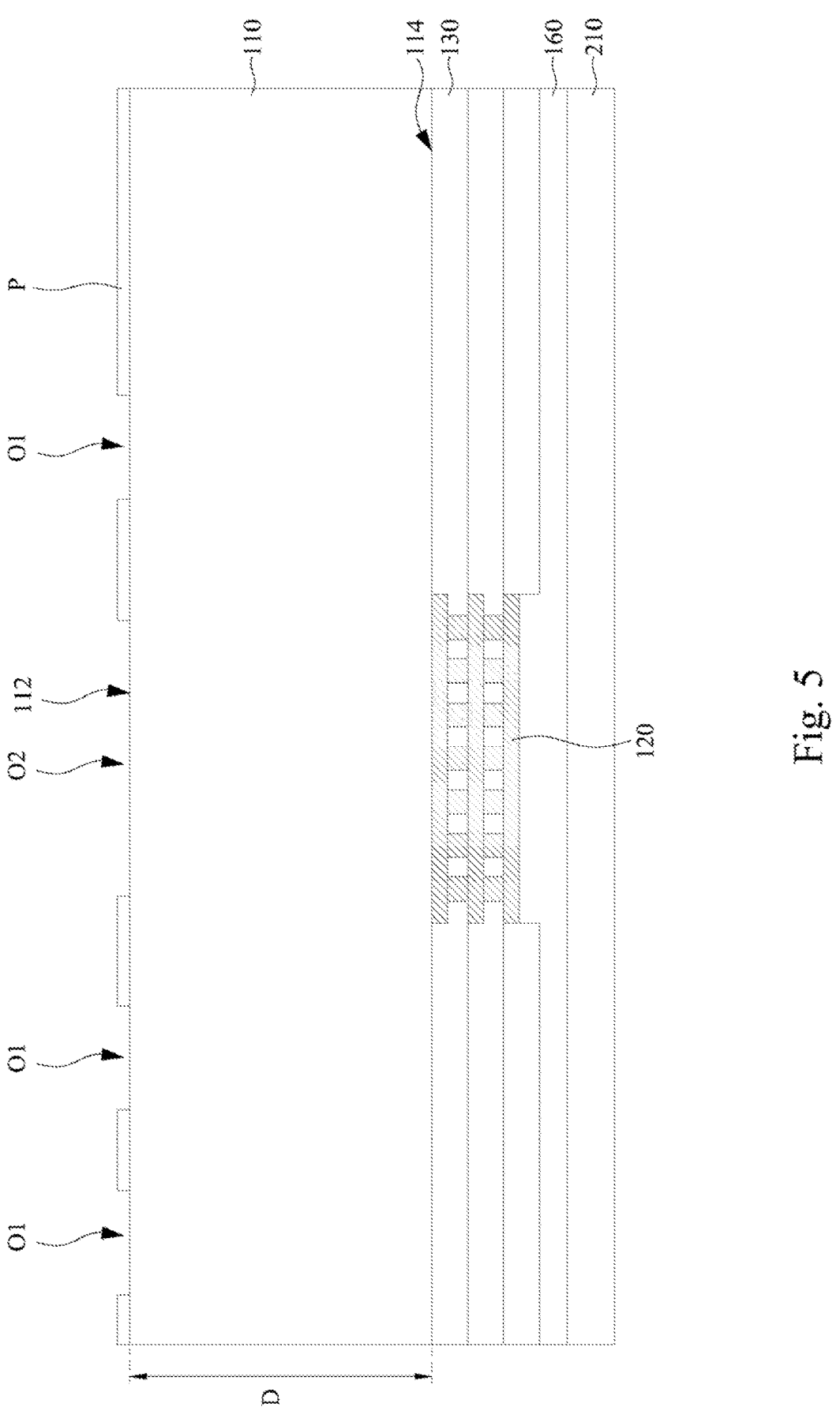
Figure 6:
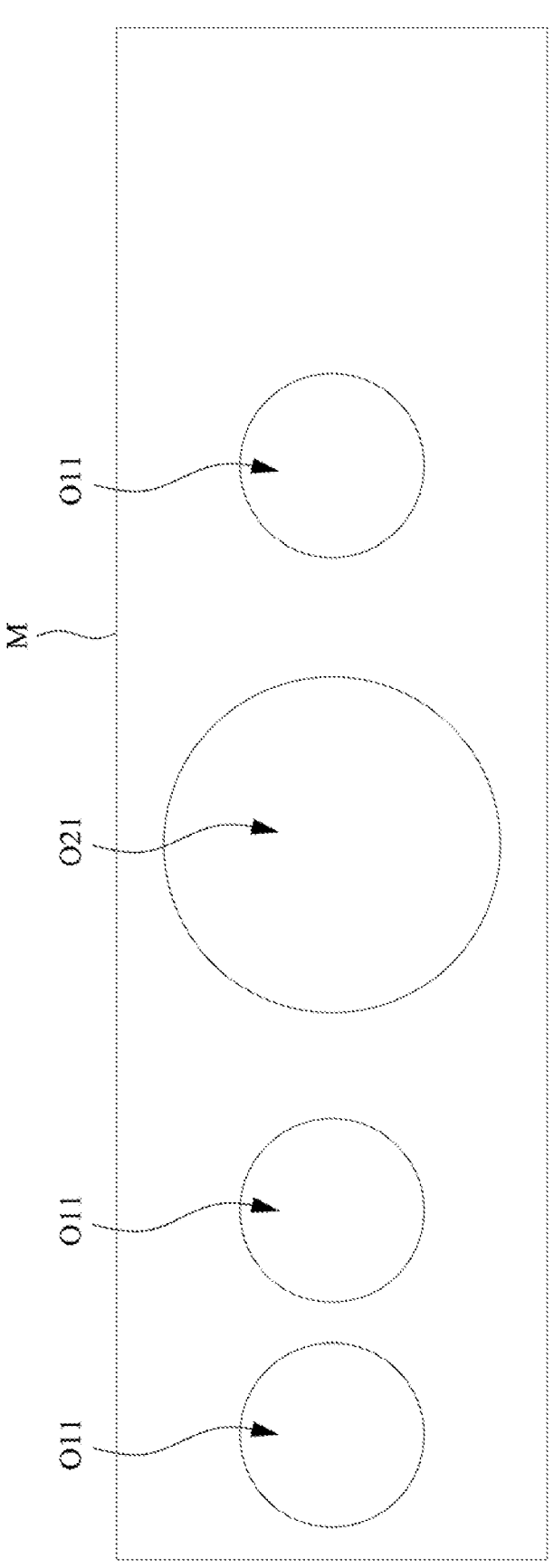

As shown in FIG. 5 and FIG. 6, afterwards, a photoresist P may be formed on the first surface 112 of the semiconductor substrate 110, and the photoresist P is patterned by a mask M to form openings O1 and O2. The mask M has openings O11 and O21, and the positions of the openings O11 and O21 of the mask M respectively correspond to the desired positions of the openings O1 and O2 to be formed. The opening O11 of the mask M is smaller than the opening O21, and the opening O1 of the photoresist P is smaller than the opening O2.

Figure 7:
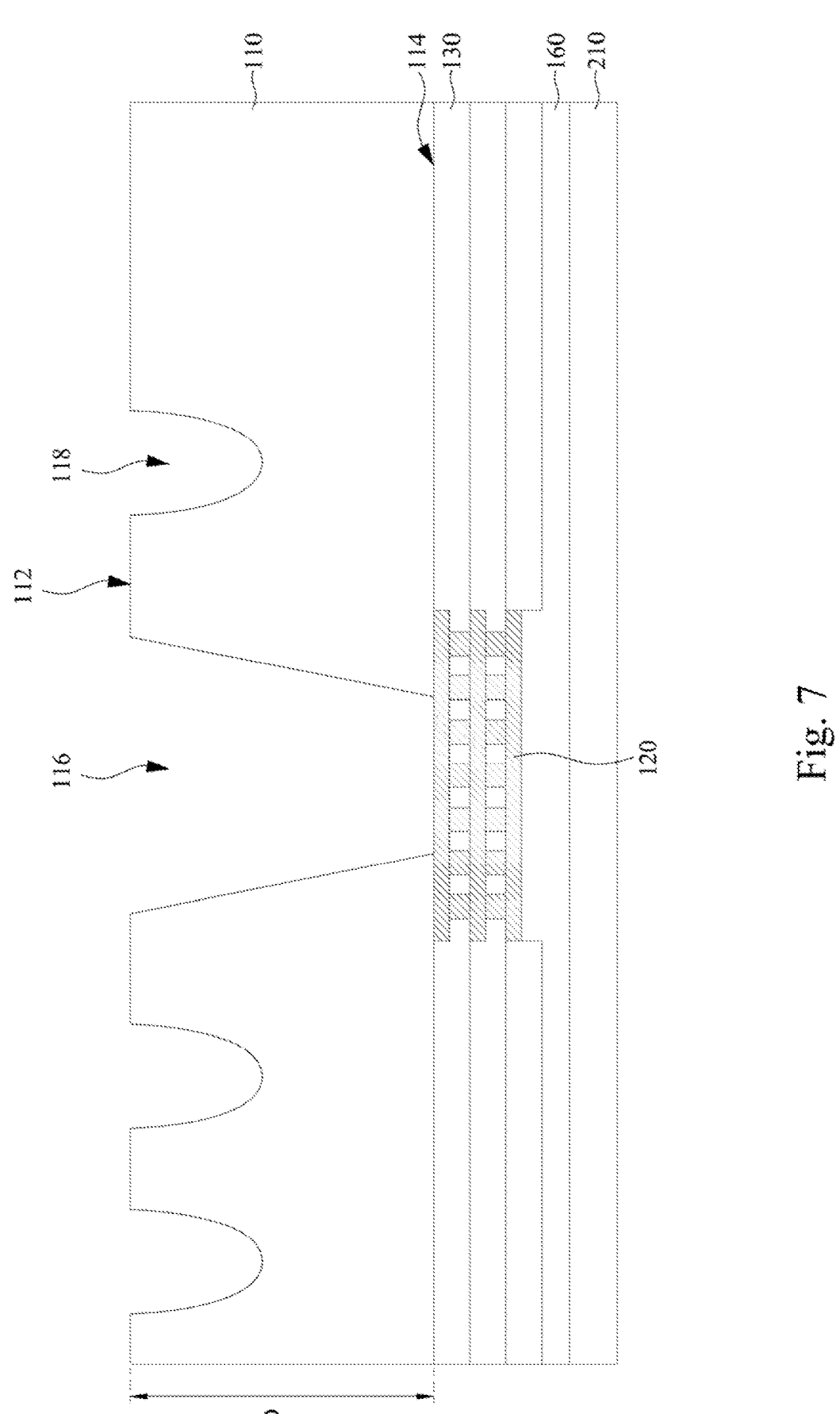

Referring to FIG. 7, after the photoresist P of FIG. 5 is formed, the semiconductor substrate 110 may be etched by using the photoresist P as a mask, such that the semiconductor substrate 110 has the through hole 116 through the first and second surfaces 112 and 114 and the recess 118 that is in the first surface 112. The conductive pad 120 is located in the through hole 116, and is exposed through the through hole 116.

Figure 8:
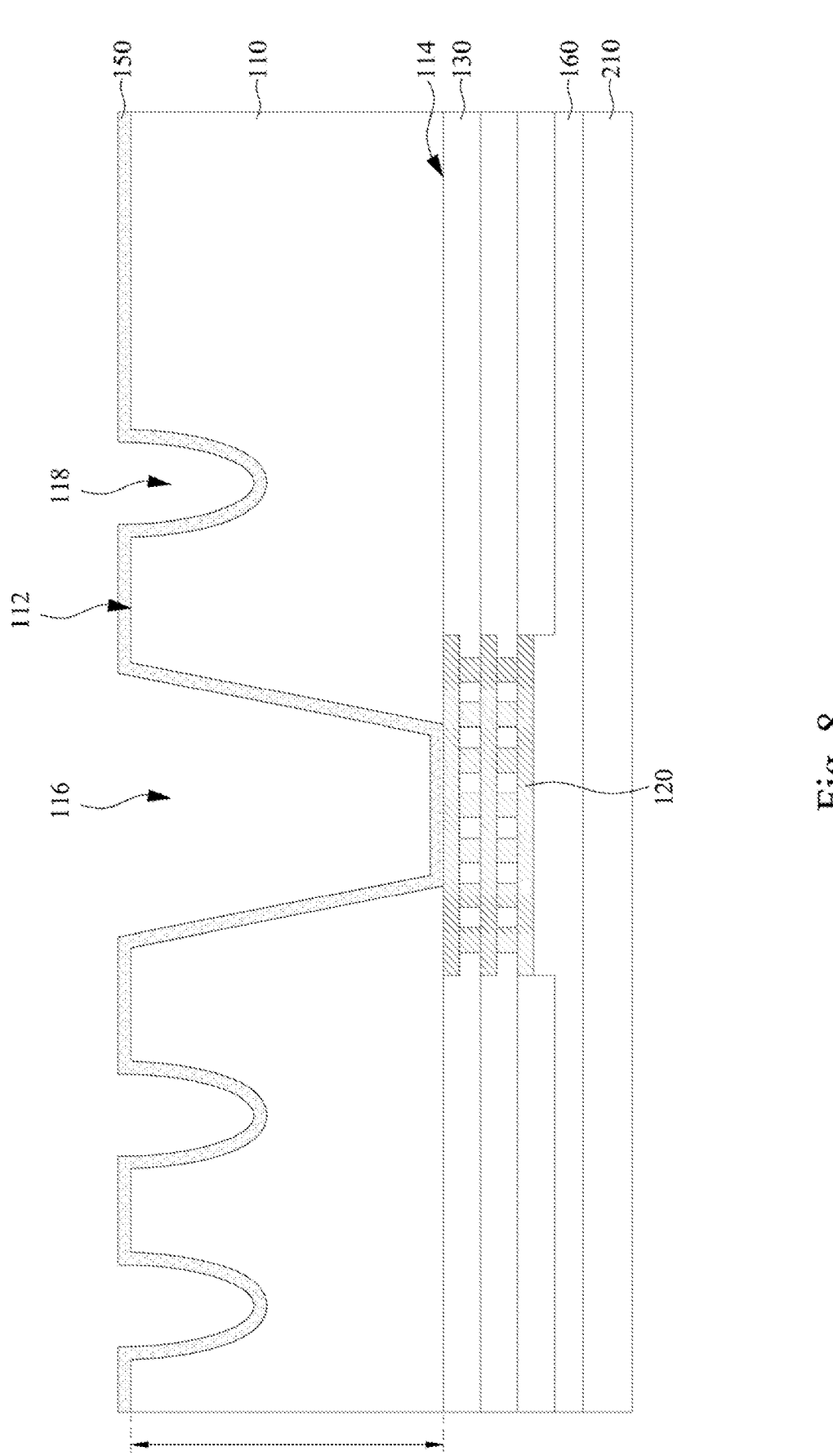

Referring to FIG. 8, after the formations of the through hole 116 and the recess 118, the seed layer 150 may be formed on the first surface 112 of the semiconductor substrate 110, in the recess 118, and on the conductive pad 120 that is in the through hole 116. The seed layer 150 may be formed by sputtering.

Figure 9:
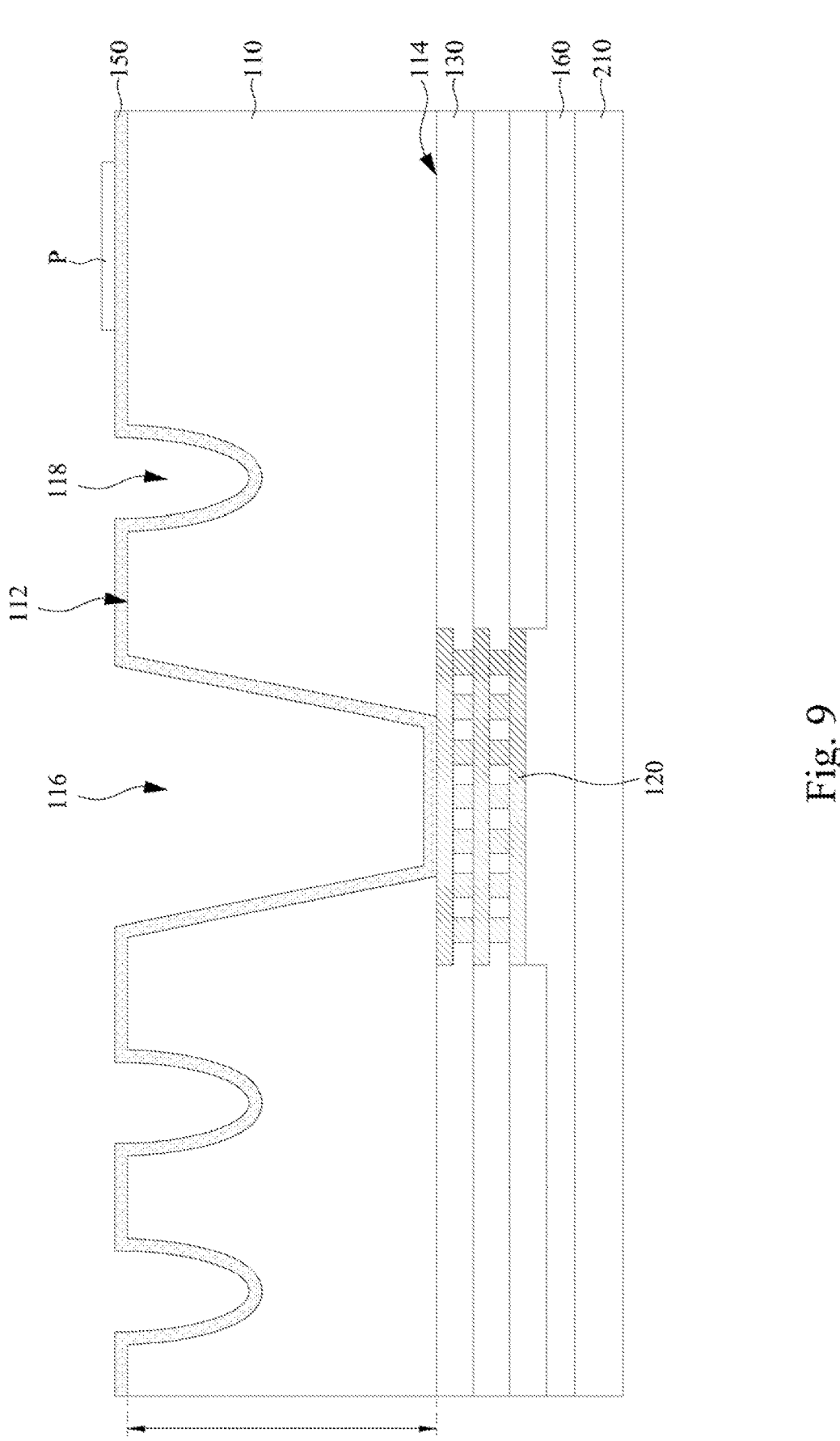
Figure 10:
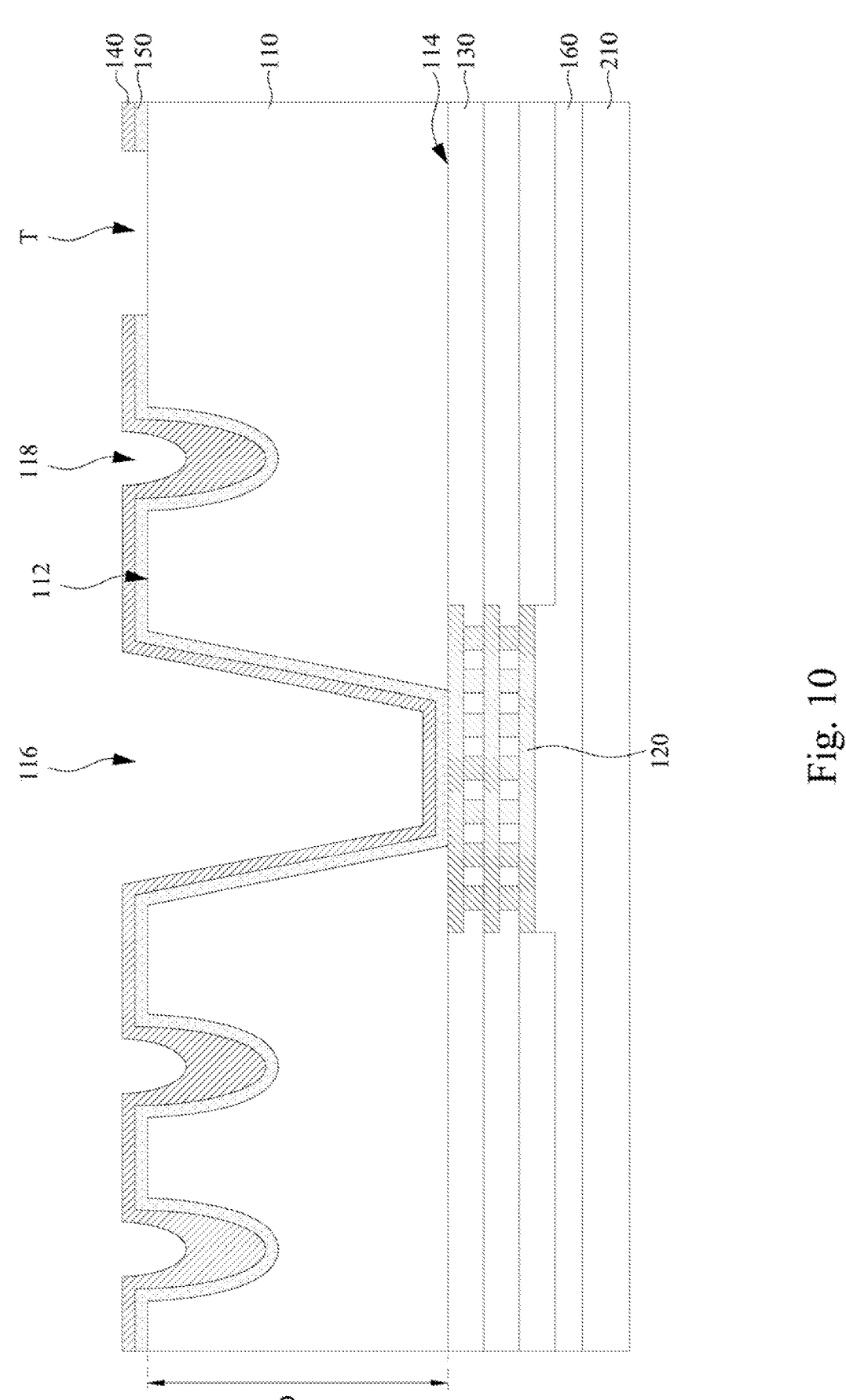

As shown in FIG. 9 and FIG. 10, thereafter, another photoresist P is formed on the seed layer 150, in which the photoresist P covers a portion of the seed layer 150 on the first surface 112. Next, the seed layer 150 is patterned to form an opening capable of defining a dicing trench T for the subsequent dicing process. The first surface 112 of the semiconductor substrate 110 may be exposed through the dicing trench T. After patterning the seed layer 150, the redistribution layer 140 can be formed on the seed layer 150, such that the redistribution layer 140 is also formed on the first surface 112 of the semiconductor substrate 110, and extends into the recess 118 and onto the conductive pad 120 in the through hole 116. The redistribution layer 140 may be formed on the seed layer 150 by electroplating. Because there is no seed layer 150 in the dicing trench T, the redistribution layer 140 is not formed at the position of the dicing trench T.

Figure 11:
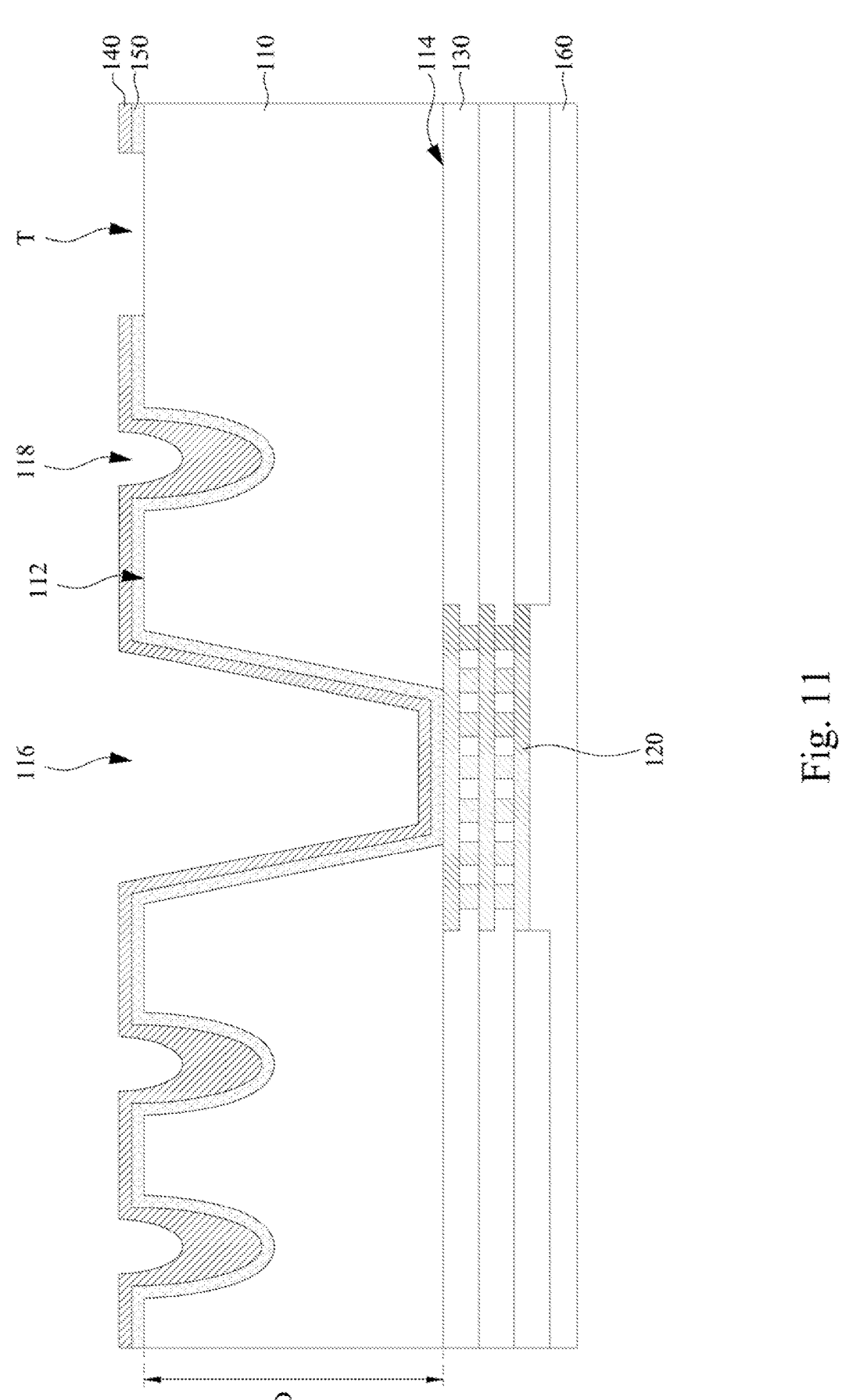

Referring to FIG. 11, after the formation of the redistribution layer 140, the carrier 210 of FIG. 10 may be removed.

Figure 12:
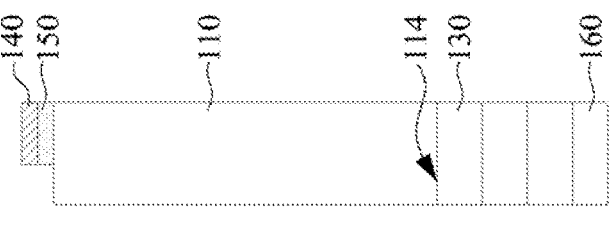

Referring to FIG. 12, after removing the carrier 210, the semiconductor substrate 110 and the isolation layer 130 may be cut along the dicing trench T (e.g., a line L), and thus the chip package 100 of FIG. 1 can be obtained.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
   a semiconductor substrate having a first surface, a second surface facing away from the first surface, a through hole through the first and second surfaces, and a recess in the first surface;
   a conductive pad located on the second surface of the semiconductor substrate and in the through hole;
   an isolation layer located on the second surface of the semiconductor substrate and surrounding the conductive pad; and
   a redistribution layer located on the first surface of the semiconductor substrate, wherein the redistribution layer is a single uninterrupted layer comprising copper, and uninterruptedly extends into the recess and onto the conductive pad in the through hole.

2. The chip package of claim 1, wherein a depth of the recess is less than a depth of the through hole.

3. The chip package of claim 1, wherein a depth of the recess is less than a thickness of the semiconductor substrate.

4. The chip package of claim 1, wherein a depth of the recess is less than a distance between the first and second surfaces of the semiconductor substrate.

5. The chip package of claim 1, wherein a diameter of the recess is less than a diameter of the through hole.

6. The chip package of claim 1, wherein a top surface of the redistribution layer on the recess is concave.

7. The chip package of claim 1, further comprising:
   a seed layer located between the redistribution layer and the first surface of the semiconductor substrate.

8. The chip package of claim 1, wherein the conductive pad comprises a plurality of metal layers electrically connected to each other, the isolation layer comprises a plurality of dielectric layers, and a number of the plurality of metal layers is the same as a number of the plurality of dielectric layers.

9. The chip package of claim 8, wherein the lowest one of the plurality of metal layers does not overlap the lowest one of the plurality of dielectric layers.

10. The chip package of claim 1, wherein the single uninterrupted layer uninterruptedly extends between the recess and the through hole.

11. A manufacturing method of a chip package, comprising:
   bonding, by a temporary bonding layer, a semiconductor substrate to a carrier, wherein the semiconductor substrate has a first surface facing away from the carrier and a second surface facing the carrier, and a conductive pad and an isolation layer are disposed on the second surface of the semiconductor substrate;
   etching the semiconductor substrate such that the semiconductor substrate has a through hole through the first and second surfaces and a recess in the first surface, wherein the conductive pad is located in the through hole;

forming a redistribution layer on the first surface of the semiconductor substrate, wherein the redistribution layer is a single uninterrupted layer comprising copper, and uninterruptedly extends into the recess and onto the conductive pad in the through hole; and removing the carrier.

12. The manufacturing method of the chip package of claim 11, further comprising:

forming a seed layer on the first surface of the semiconductor substrate, in the recess, and on the conductive pad that is in the through hole.

13. The manufacturing method of the chip package of claim 12, further comprising:

forming the redistribution layer on the seed layer.

14. The manufacturing method of the chip package of claim 13, wherein the redistribution layer is formed on the seed layer by electroplating.

15. The manufacturing method of the chip package of claim 12, further comprising:

patterning the seed layer such that an opening of the seed layer defines a dicing trench.

16. The manufacturing method of the chip package of claim 15, further comprising:

after removing the carrier, cutting the semiconductor substrate and the isolation layer along the dicing trench.

17. The manufacturing method of the chip package of claim 11, further comprising:

prior to etching the semiconductor substrate, grinding the first surface of the semiconductor substrate to thin the semiconductor substrate.

18. The manufacturing method of the chip package of claim 11, wherein the single uninterrupted layer uninterruptedly extends between the recess and the through hole.

* * * * *